(12) United States Patent
Wu (10) Patent No.: US 10,874,023 B2
(45) Date of Patent: Dec. 22, 2020

(54) RECIPROCATOR-TYPE QUICK-RELEASING MECHANISM

(71) Applicant: Wistron Corporation, New Taipei (TW)

(72) Inventor: Ku-Chou Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/705,092

(22) Filed: Dec. 5, 2019

(65) Prior Publication Data

US 2020/0120820 A1 Apr. 16, 2020

Related U.S. Application Data

(63) Continuation of application No. 15/460,218, filed on Mar. 15, 2017, now Pat. No. 10,568,220.

(30) Foreign Application Priority Data

Nov. 1, 2016 (TW) .............................. 105135281 A (51) Int. Cl.
*H05K 5/02* (2006.01)
*F16B 21/10* (2006.01)

(52) U.S. Cl.
CPC ........... *H05K 5/0221* (2013.01); *F16B 21/10* (2013.01); *Y10T 403/591* (2015.01)

(58) Field of Classification Search
CPC ........ F16B 7/042; F16B 17/004; F16B 21/10; F16B 21/12; F16B 21/125; F16B 2021/14; H05K 5/0221; Y10T 403/54; Y10T 403/59; Y10T 403/591; Y10T 403/598; Y10T 403/599; Y10T 403/60; Y10T 403/602; Y10T 403/604; Y10T 403/75
USPC .... 403/291, 321, 322.1, 324, 325, 326, 327, 403/328, 408.1, DIG. 4
See application file for complete search history.

(56) References Cited

U.S. PATENT DOCUMENTS

| | | | | |
|---|---|---|---|---|
| 5,842,254 A | * | 12/1998 | Lee | A47L 5/00 403/325 |
| 6,014,793 A | * | 1/2000 | Howald | A44C 5/147 24/115 G |
| 7,539,521 B2 | * | 5/2009 | Nam | H04M 1/0262 455/575.1 |

(Continued)

*Primary Examiner* — Josh Skroupa
(74) *Attorney, Agent, or Firm* — Winston Hsu (57) ABSTRACT

A reciprocator-type quick-releasing mechanism includes a base, a latching component and an actuating component. The base has a first piercing hole and a first opening. The latching component is disposed on the base and includes a constraining portion and a resilient portion. The constraining portion is disposed inside the first piercing hole and connected to the resilient portion. The actuating is component disposed on the base and includes a pushing portion and an actuating portion. The pushing portion contacts the resilient portion to guide the resilient portion and connected to the actuating portion for aligning the first opening and a second opening on an external unit. The actuating portion is moved to slide the resilient portion, so as to move the constraining portion through the first piercing hole for letting the constraining portion leave a second piercing hole or pushing a buckling portion on the external unit.

9 Claims, 13 Drawing Sheets

(56) References Cited

U.S. PATENT DOCUMENTS

| | | | | |
|---|---|---|---|---|
| 7,842,412 B2* | 11/2010 | Zhang | ................ | H01M 2/1066 |
| | | | | 429/97 |
| 8,711,560 B2* | 4/2014 | Wang | ................ | H04M 1/0262 |
| | | | | 361/679.58 |
| 9,036,335 B2* | 5/2015 | Liang | ................ | H05K 5/0221 |
| | | | | 403/327 |
| 9,311,571 B2* | 4/2016 | Lei | ................ | G06K 13/0812 |

* cited by examiner

RECIPROCATOR-TYPE QUICK-RELEASING MECHANISM

CROSS REFERENCE TO RELATED APPLICATIONS

This is a continuation application of U.S. patent application Ser. No. 15/460,218, filed on Mar. 15, 2017. The above mentioned applications are included in their entirety herein by reference.

BACKGROUND OF THE INVENTION

1. Field of the Invention

The present disclosure relates to a quick-releasing mechanism, and more particularly, to a reciprocator-type quick-releasing mechanism of conveniently assembling a first module with a second module.

2. Description of the Prior Art

A conventional detachable keyswitch is moved at a single operation direction, and an engaging structure of the conventional detachable keyswitch is directly installed inside a hole formed on a casing. For disassembly of the conventional detachable keyswitch, the engaging structure is pulled open by high pressure to separate the keyswitch and the casing, therefore the engaging structure of the conventional detachable keyswitch is easily broken due to violent force or is easily abraded and deformed in accordance with stress concentration, and has a drawback of short serviceable period. Another conventional double-click push latch utilizes a hook movably inside a track to lock the push latch on the casing, and has drawbacks of lower loading capability because of being made by small-size plastic material and limited range of application.

SUMMARY OF THE INVENTION

The present disclosure provides a reciprocator-type quick-releasing mechanism of conveniently assembling a first module with a second module for solving above drawbacks.

According to the claimed disclosure, a reciprocator-type quick-releasing mechanism of conveniently assembling a first module with a second module is disclosed. The reciprocator-type quick-releasing mechanism includes a base, a latching component and an actuating component. The base is disposed inside the first module, and the base has a first piercing hole and a first opening. The latching component is disposed on the base. The latching component includes a constraining portion and a resilient portion. The constraining portion is disposed inside the first piercing hole. The resilient portion is connected to the constraining portion in a relative slidable manner. The actuating is component slidably disposed on the base. The actuating component includes a pushing portion and an actuating portion. The pushing portion contacts the resilient portion to guide a movement of the resilient portion. The actuating portion is connected to the pushing portion and aligns with the first opening and a second opening on the second module. The actuating portion moves relative to the second opening by an external force to slide the resilient portion relative to the constraining portion via the pushing portion, so as to move the constraining portion through the first piercing hole for letting the constraining portion leave away a second piercing hole on the second module or pushing a buckling portion of the second module.

According to the claimed disclosure, a first inclined guiding structure is disposed on an edge of the constraining portion, a second inclined guiding structure is disposed on a lateral surface of the resilient portion, and the second inclined guiding structure slidably contacts against the first inclined guiding structure.

According to the claimed disclosure, the base further includes a guiding portion whereon the resilient portion is movably disposed.

According to the claimed disclosure, the reciprocator-type quick-releasing mechanism further includes a resilient component disposed on the guiding portion, two opposite ends of the resilient component respectively contact against the latching component and the actuating component, or respectively contact against the latching component and the base.

According to the claimed disclosure, the latching component further includes a recovering component disposed on the constraining portion, two opposite ends of the recovering component respectively contact against the base and a block of the constraining portion.

According to the claimed disclosure, the actuating component is disposed on the base, the actuating component is assembled with the latching component in an inseparable manner.

According to the claimed disclosure, the constraining portion simultaneously passes through the first piercing hole and the second piercing hole to constrain a relative movement between the first module and the second module.

According to the claimed disclosure, the actuating component is disposed on the second module, the latching component is actuated by the actuating component in a separable manner.

According to the claimed disclosure, the buckling portion of the second module is buckled with the first piercing hole on the base.

The user can press the reciprocator-type quick-releasing mechanism exposed from the outer surface of the second module to release constraint of a relative movement between the first module and the second module. The reciprocator-type quick-releasing mechanism can be arbitrarily disposed on a bottom surface or a lateral surface of the second module, which depends on user's demand. The present disclosure provides several embodiments of the reciprocator-type quick-releasing mechanism, the reciprocator-type quick-releasing mechanism can be activated by the pressing or pulling manner, and the reciprocator-type quick-releasing mechanism has an automatic recovering function for rapidly assembly and disassembly of the first module and the second module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
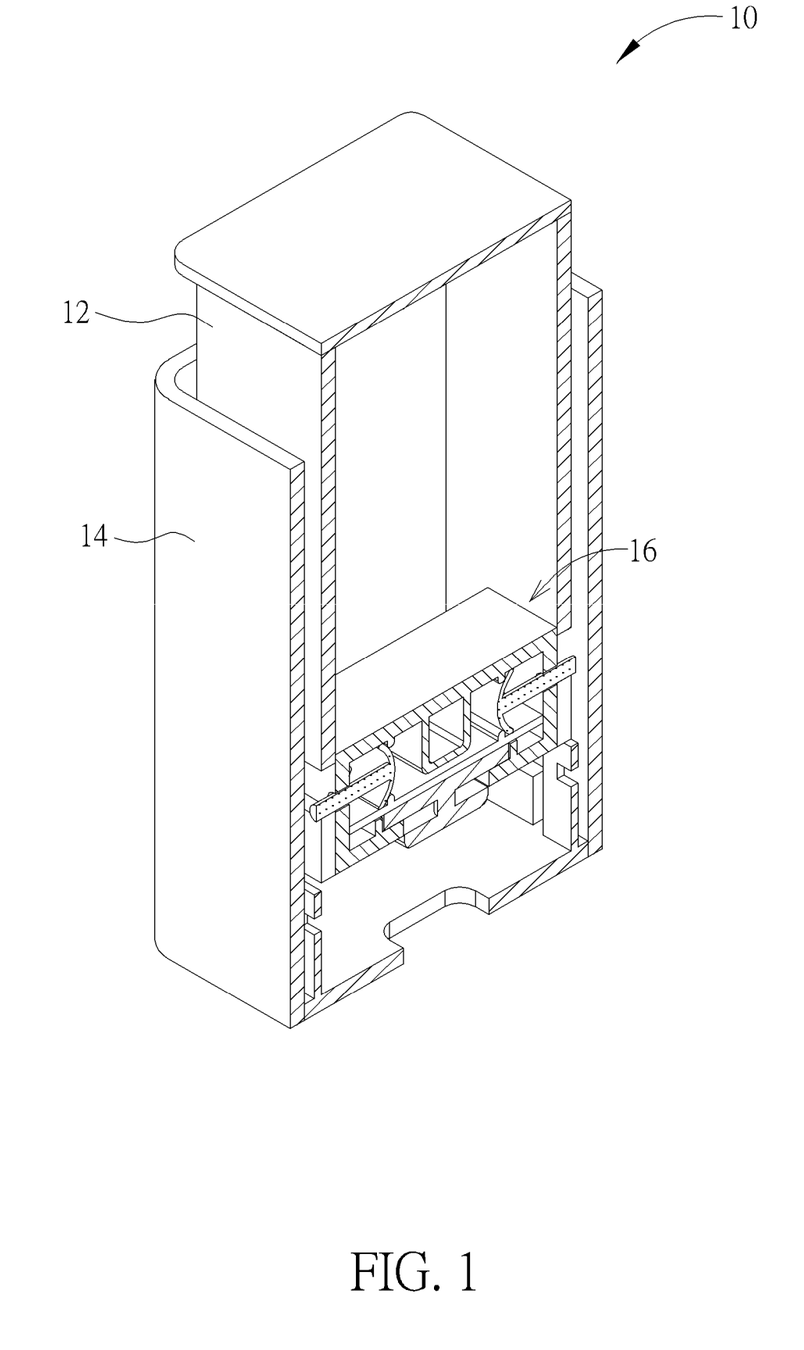
FIG. 1 is a diagram of an electronic apparatus according to an embodiment of the present disclosure.

Please refer to FIG. 1. FIG. 1 is a diagram of an electronic apparatus 10 according to an embodiment of the present disclosure. The electronic apparatus 10 can be a personal computer or a server host. The electronic apparatus 10 mainly includes a first module 12, a second module 14 and a reciprocator-type quick-releasing mechanism 16. The first module 12 can be utilized to accommodate inner components of the electronic apparatus 10, and the said inner components can be a circuit board or a storage hard disk. The first module 12 is assembled inside the second module 14 via the reciprocator-type quick-releasing mechanism 16 in a detachable manner. The second module 14 can be a housing of the electronic apparatus 10 and is made of plastic material. The reciprocator-type quick-releasing mechanism 16 is located between the first module 12 and the second module 14, and the user can activate the reciprocator-type quick-releasing mechanism 16 from outside of the second module 14 for convenient assembly and disassembly of the first module 12 the second module 14.

Figure 2:
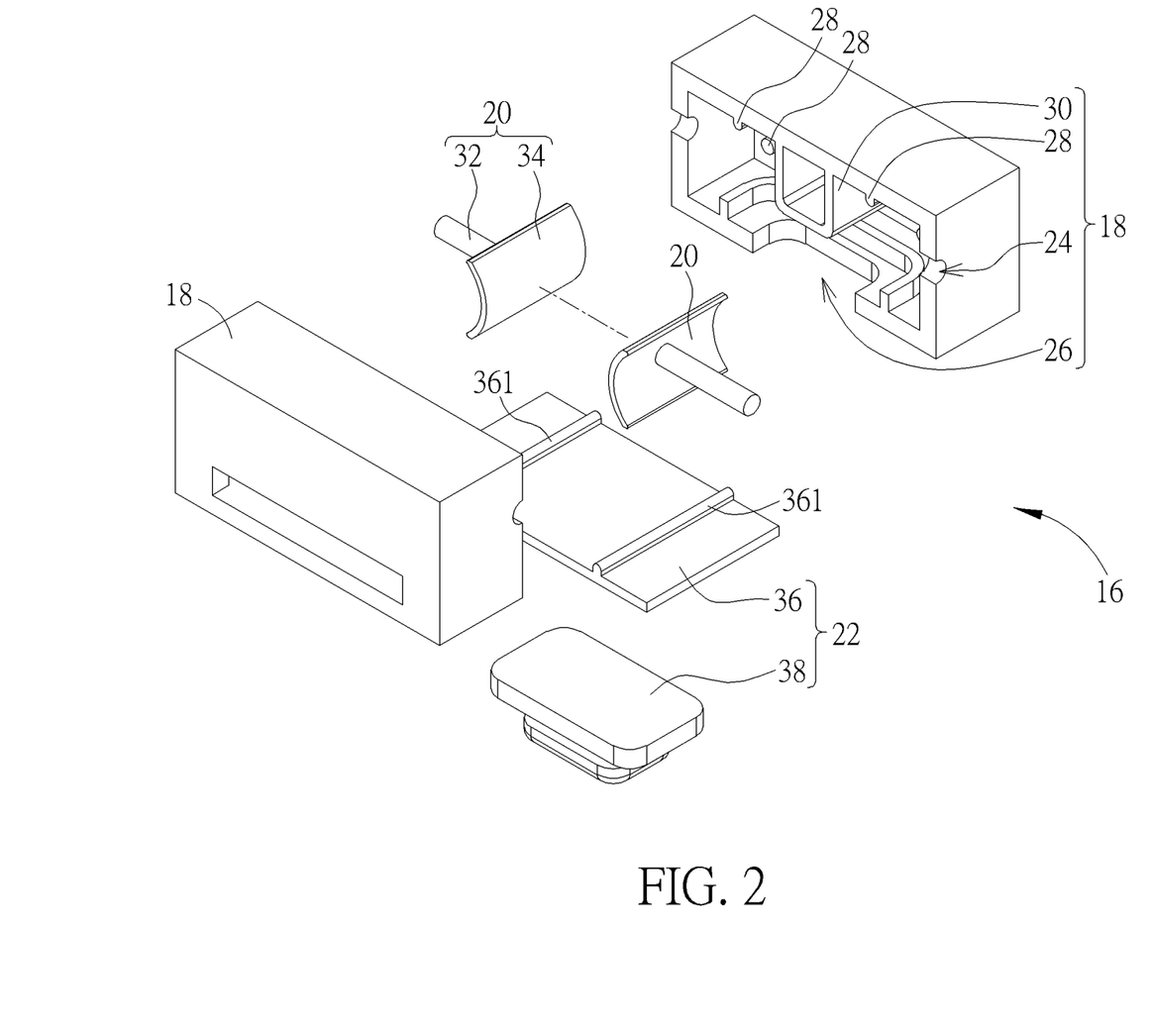
FIG. 2 is an exploded diagram of a reciprocator-type quick-releasing mechanism according to a first embodiment of the present disclosure.
Figure 3:
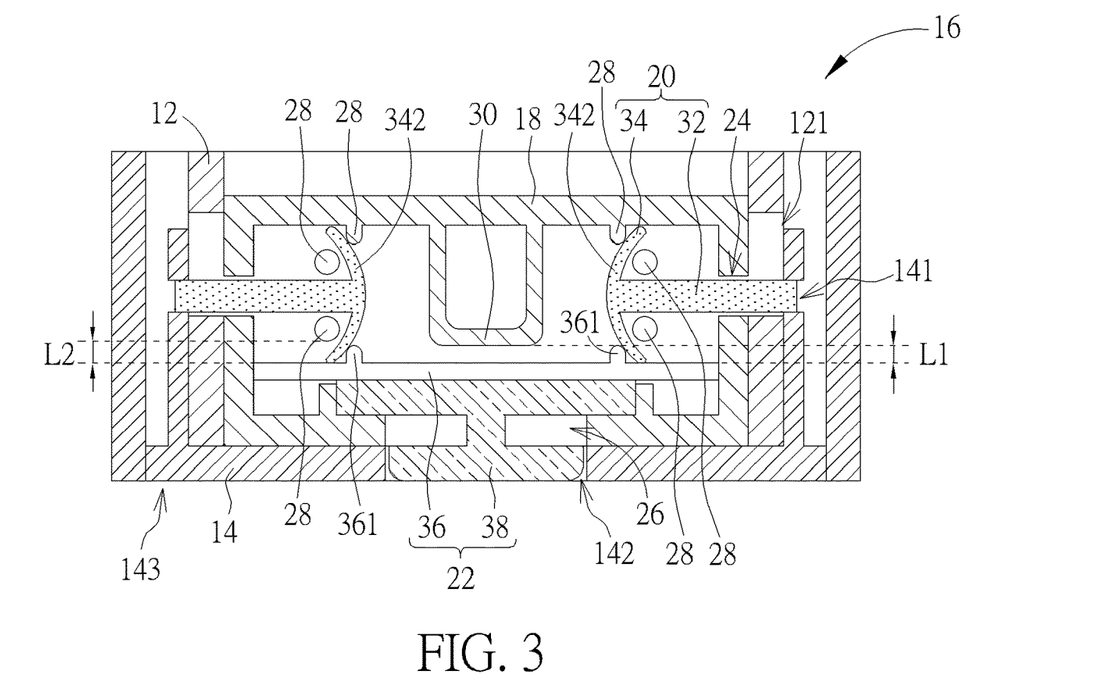
FIG. 3 and FIG. 4 respectively are diagrams of the reciprocator-type quick-releasing mechanism in different operation modes according to the first embodiment of the present disclosure.
Figure 4:
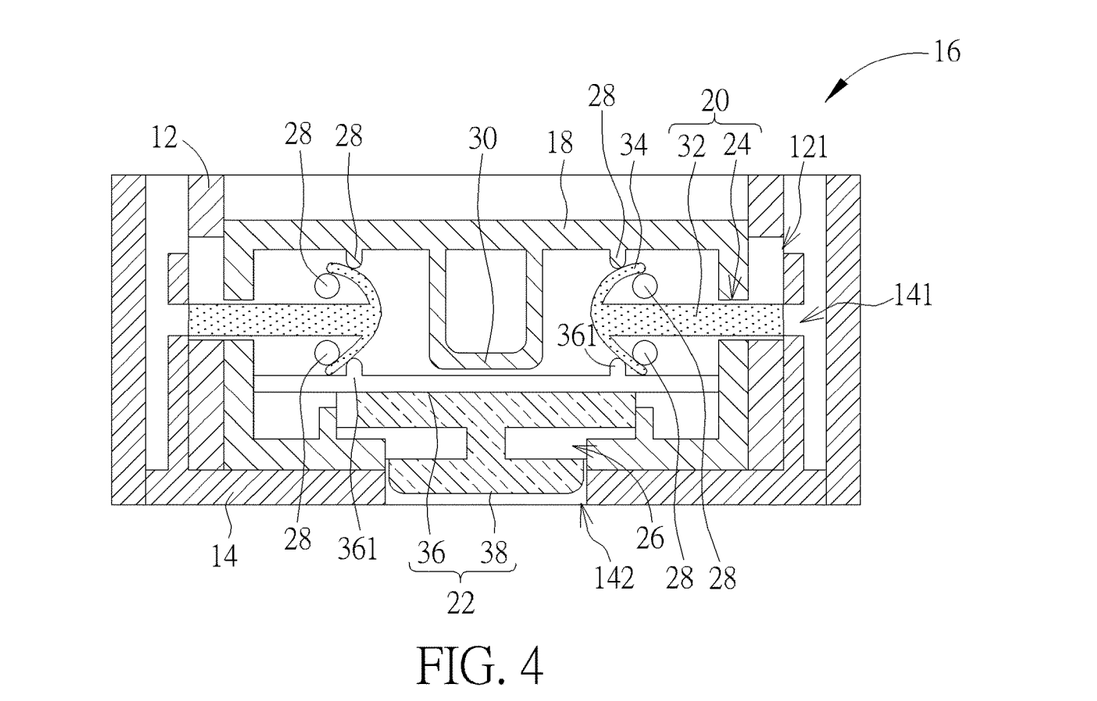

Please refer to FIG. 2 to FIG. 4. FIG. 2 is an exploded diagram of the reciprocator-type quick-releasing mechanism 16 according to a first embodiment of the present disclosure. FIG. 3 and FIG. 4 respectively are diagrams of the reciprocator-type quick-releasing mechanism 16 in different operation modes according to the first embodiment of the present disclosure. The reciprocator-type quick-releasing mechanism 16 includes a base 18, a latching component 20 and an actuating component 22. The base 18 is disposed inside the first module 12, for example, the base 18 can be disposed by an inner side of the first module 12 adjacent to the second module 14. The latching component 20 can be movably protruded from the first module 12 by the actuating component 22 to generate structural interference with the second module 14, for aims of assembling and disassembling the first module 12 and the second module 14. Further, the base 18 includes a first piercing hole 24, a first opening 26, an engaging portion 28 and a stopping portion 30. The latching component 20 is disposed on the base 18. A constraining portion 32 of the latching component 20 can insert into the first piercing hole 24, a corresponding aperture 121 formed on the first module 12 and a second piercing hole 141 formed on the second module 14 in reciprocation. A resilient portion 34 of the latching component 20 is connected to an end of the constraining portion 32. One of positioning ends 342 of the resilient portion 34 is disposed between a plurality of engaging portions 28 on the base 18 in a resilient deformable manner, and the other positioning end 342 of the resilient portion 34 movably contacts against a pushing portion 36. The resilient portion 34 can be located between the base 18 and the actuating component 22.

The actuating component 22 is slidably disposed on the base 18. The actuating component 22 mainly includes the pushing portion 36 and an actuating portion 38. The pushing portion 36 and the actuating portion 38 can be two independent units or monolithically integrated with each other. An engaging striped block 361 can be formed on a surface of the pushing portion 36, and the engaging striped block 361 and the engaging portion 28 are utilized to constrain the resilient portion 34 located between the base 18 and the actuating component 22. While the pushing portion 36 and the actuating portion 38 are two independent units, the actuating portion 38 is connected to the pushing portion 36 in a separable manner, and the actuating portion 38 can be optionally disposed on the base 18 or the second module 14. While the pushing portion 36 and the actuating portion 38 are monolithically integrated with each other, the actuating portion 38 is directly connected to the pushing portion 36, and the actuating portion 38 is disposed on the base 18. The actuating portion 38 can align with the first opening 26 and a second opening 142 formed on the second module 14, and preferably does not protrude from an outer surface 143 of the second module 14 for convenient operation. The user can handle the actuating portion 38 from outside of the second module 14 to activate the reciprocator-type quick-releasing mechanism 16.

In the first embodiment, the resilient portion 34 is an arc structure. Two opposite ends of the resilient portion 34 respectively contact against the base 18 and the pushing portion 36 via the engaging portion 28 and the engaging striped block 361, and the constraining portion 32 is connected to a middle region of the resilient portion 34. As shown in FIG. 3, the reciprocator-type quick-releasing mechanism 16 is set in an initial mode, the actuating portion 38 aligns with the second opening 142, and a bending angle of the resilient portion 34 is utilized to maintain the constraining portion 32 kept at a mode passing through the second piercing hole 141 for structural interference; meanwhile, the first module 12 cannot be disassembled from the second module 14. As shown in FIG. 4, the actuating portion 38 is pressed to move into the second opening 142, the resilient portion 34 is flexibly deformed by pressure of the pushing portion 36, the constraining portion 32 is moved deeply into the base 18 and left away the second piercing hole 141 while the resilient portion 34 is flexibly and resiliently deformed, and the first module 12 can be freely disassembled from the second module 14. It should be mentioned that a stopping portion 30 of the base 18 is disposed on a position near to the actuating component 22 rather than the engaging portion 28; for example, a first interval L1 between the stopping portion 30 and the actuating component 22 is preferably smaller than a second interval L2 between the engaging portion 28 and the actuating component 22. The actuating component 22 is stopped moving while the actuating component 22 is moved into the base 18 and contacts against the stopping portion 30, so as to constrain a movement of the actuating component 22 inside the base 18.

Figure 5:
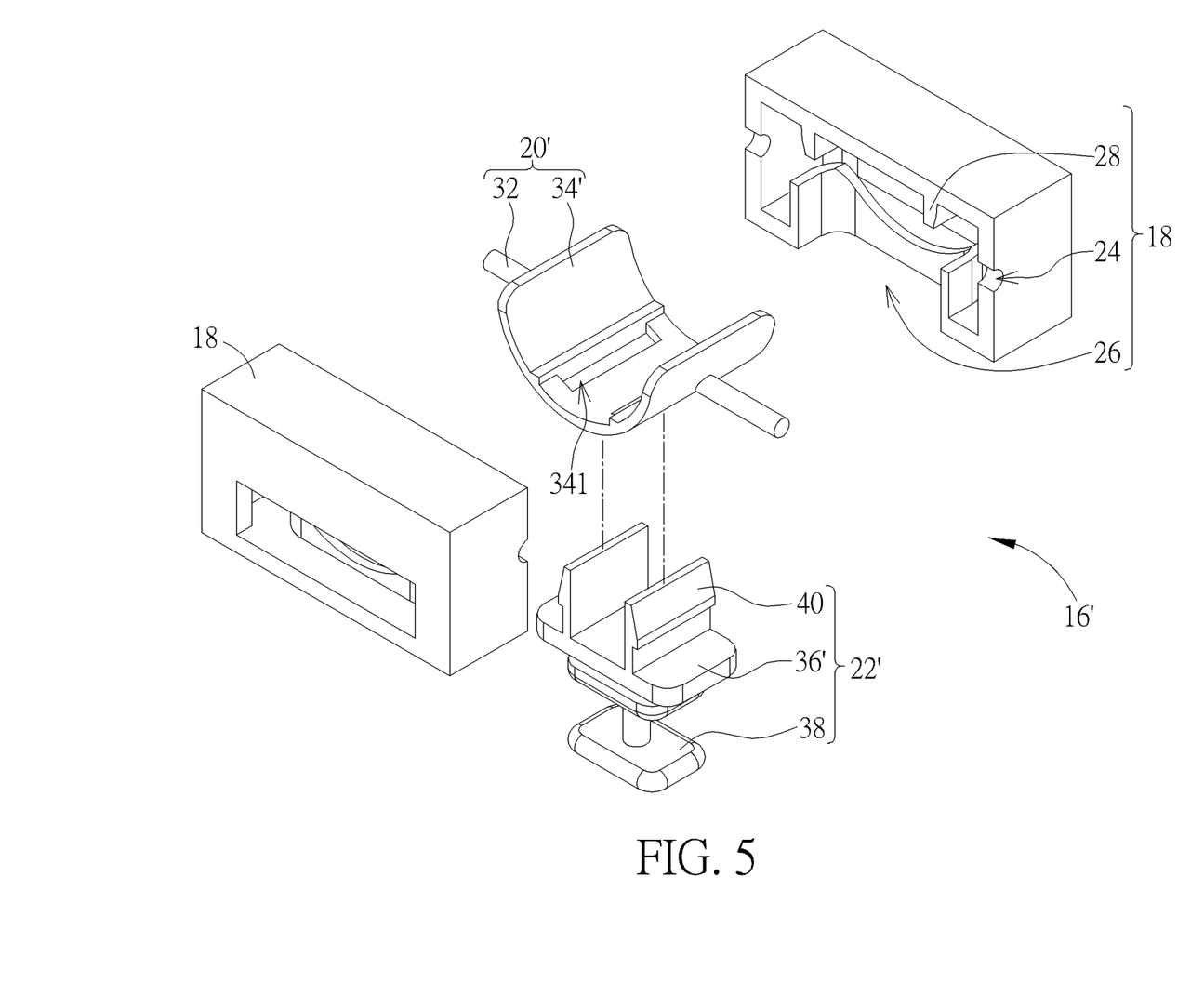
FIG. 5 is an exploded diagram of the reciprocator-type quick-releasing mechanism according to a second embodiment of the present disclosure.
Figure 6:
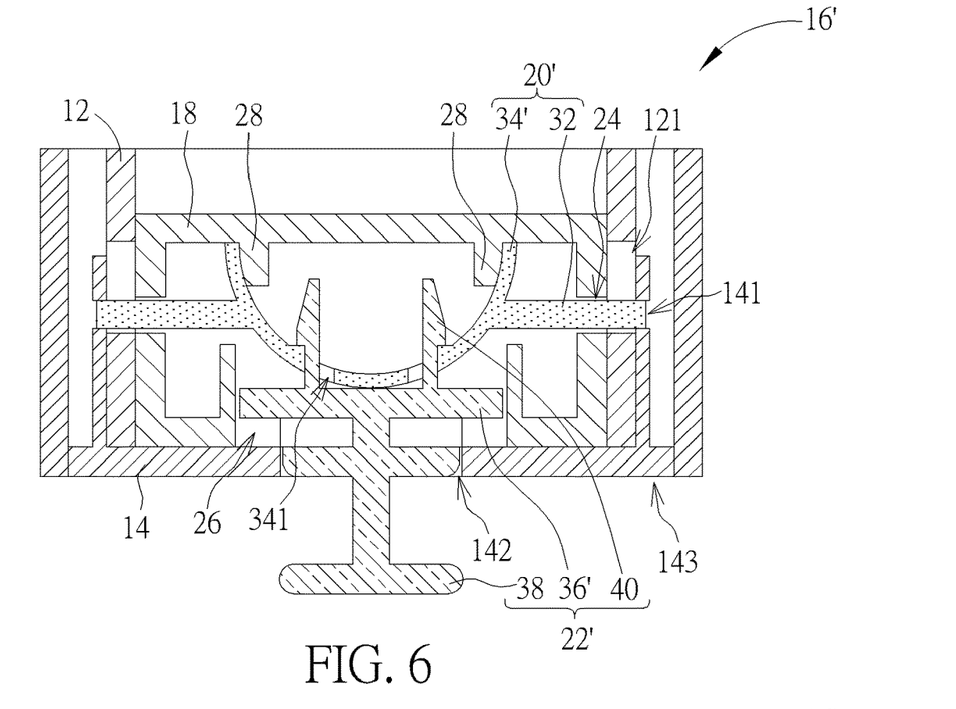
FIG. 6 and FIG. 7 respectively are diagrams of the reciprocator-type quick-releasing mechanism in different operation modes according to the second embodiment of the present disclosure.
Figure 7:
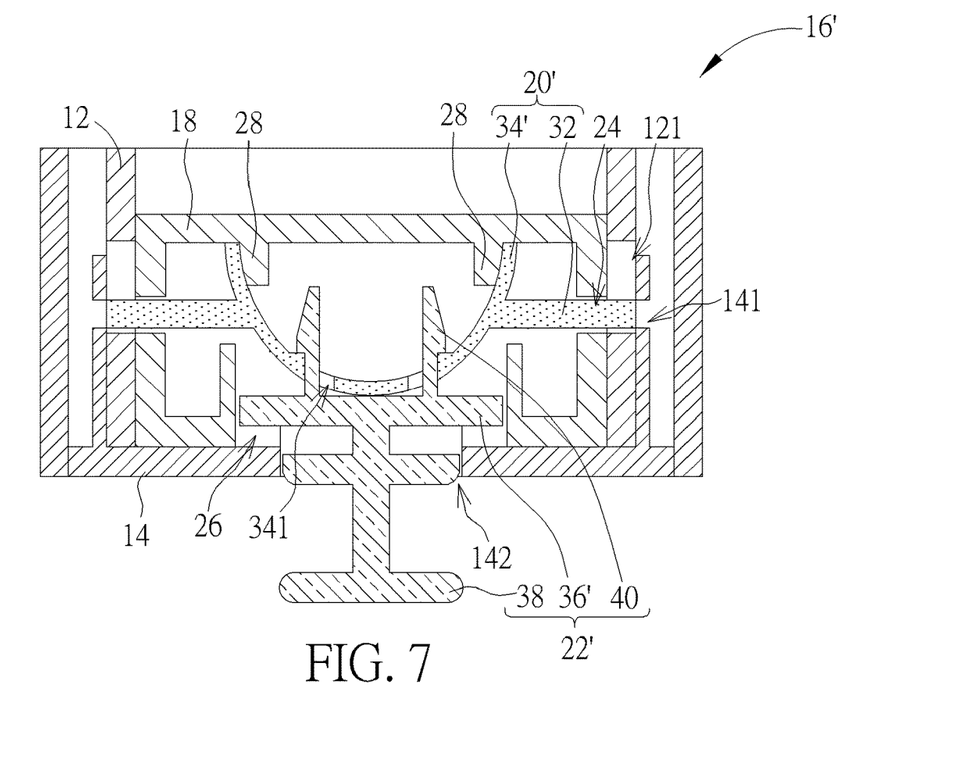

Please refer to FIG. 5 to FIG. 7. FIG. 5 is an exploded diagram of the reciprocator-type quick-releasing mechanism 16' according to a second embodiment of the present disclosure. FIG. 6 and FIG. 7 respectively are diagrams of the reciprocator-type quick-releasing mechanism 16' in different operation modes according to the second embodiment of the present disclosure. In the second embodiment, elements having the same numerals as one of the first embodiment have the same structures and functions, and a detailed description is omitted herein for simplicity. The reciprocator-type quick-releasing mechanism 16' mainly includes the base 18, the latching component 20' and the actuating component 22'. The actuating portion 38 of the reciprocator-type quick-releasing mechanism 16' aligns with the second opening 142, and partly protrudes from the outer surface 143 for being conveniently pulled and/or pushed by the user. In the second embodiment, the reciprocator-type quick-releasing mechanism 16' is operated by pulling the actuating component 22' outwardly, and the base 18 may have no stopping portion. The constraining portion 32 of the latching component 20' can movably insert into the first piercing hole 24 formed on the base 18, the corresponding aperture 121 formed on the first module 12, and the second piercing hole 141 formed on the second module 14. The resilient portion 34' of the latching component 20' can be the arc structure. Two opposite ends of the resilient portion 34' are respectively engaged with the engaging portions 28 of the base 18. The actuating component 22' may further include a hooking portion 40 disposed on a side of the pushing portion 36' opposite to the actuating portion 38. The hooking portion 40 is hooked with a break 341 on the resilient portion 34', which means the pushing portion 36' can press the middle region of the resilient portion 34' via the hooking portion 40 in a separable manner.

As shown in FIG. 6, the reciprocator-type quick-releasing mechanism 16' is set in an initial mode, the actuating portion 38 is partly protruded out of the second opening 142 preferably, the bending angle of the resilient portion 34' is utilized to maintain the constraining portion 32 kept at a mode passing through the second piercing hole 141 for the structural interference, and the first module 12 cannot be disassembled from the second module 14. As shown in FIG. 7, the actuating portion 38 is outwardly pulled by the user, the hooking portion 40 is hooked with the break 341, and the latching component 20' is resiliently deformed by the actuating component 22'. The latching component 20' resiliently deformed can move the constraining portion 32 deeply into the base 18 and the constraining portion 32 is left away the second piercing hole 141, and the first module 12 can be freely disassembled from the second module 14. Therefore, the reciprocator-type quick-releasing mechanism in the first embodiment and the second embodiment are respectively activated by the pressing and pulling manner, so as to move the latching component of the reciprocator-type quick-releasing mechanism out of the second piercing hole 141 on the second module 14.

Figure 8:
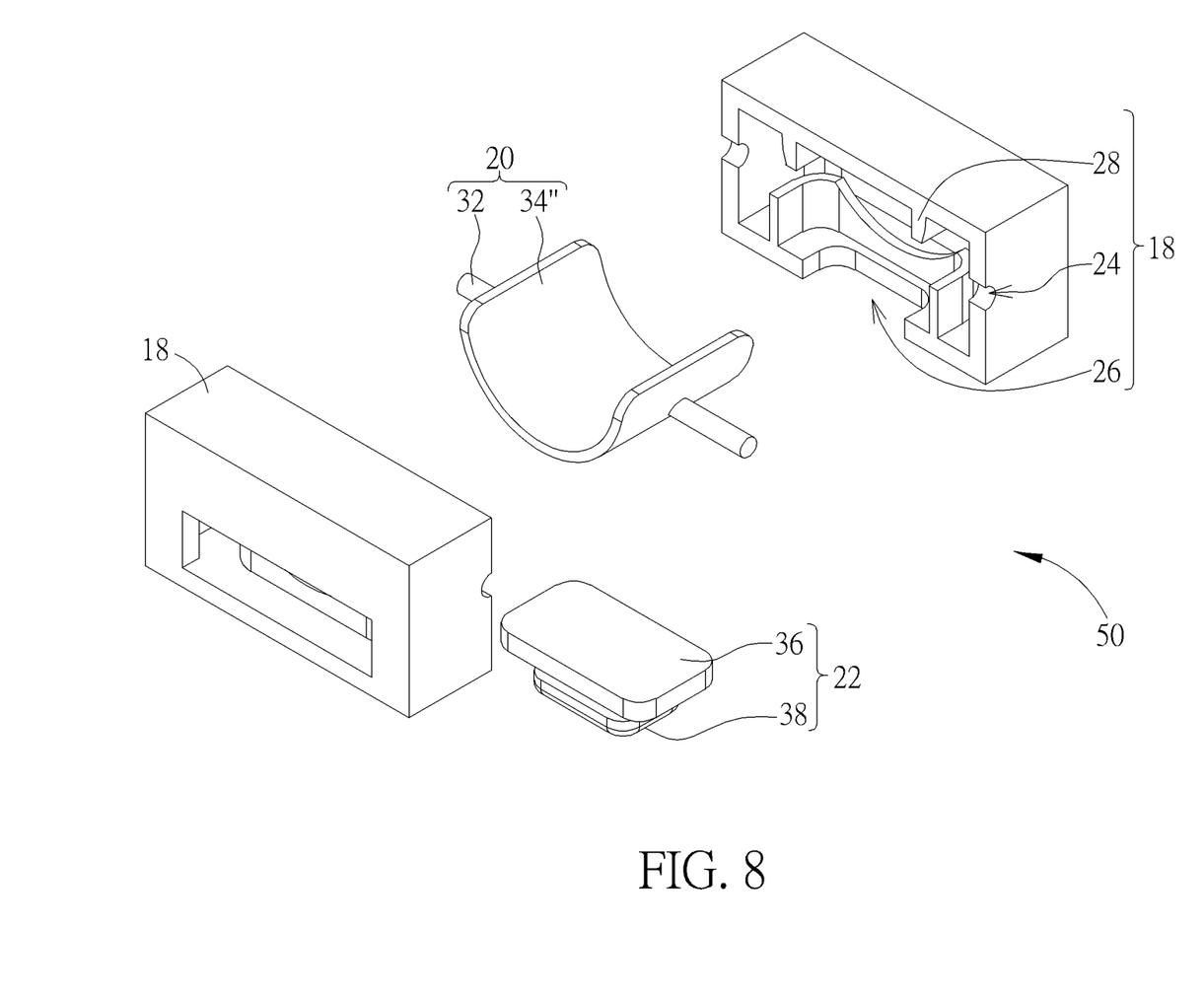
FIG. 8 is an exploded diagram of the reciprocator-type quick-releasing mechanism according to a third embodiment of the present disclosure.
Figure 9:
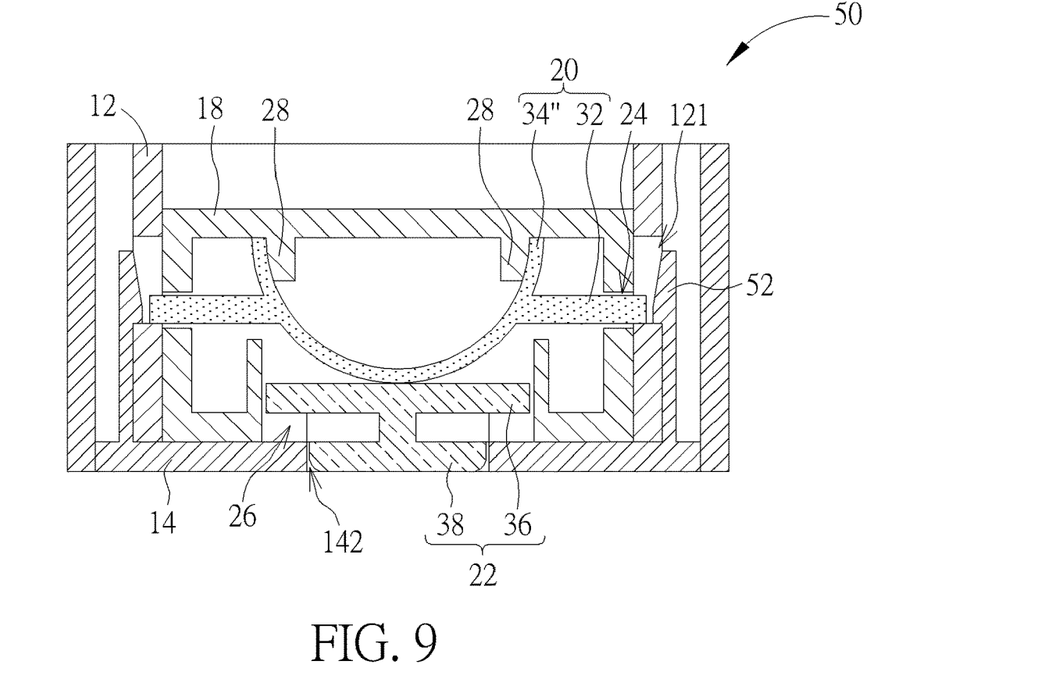
FIG. 9 and FIG. 10 respectively are diagrams of the reciprocator-type quick-releasing mechanism in different operation mode according to the third embodiment of the present disclosure.
Figure 10:
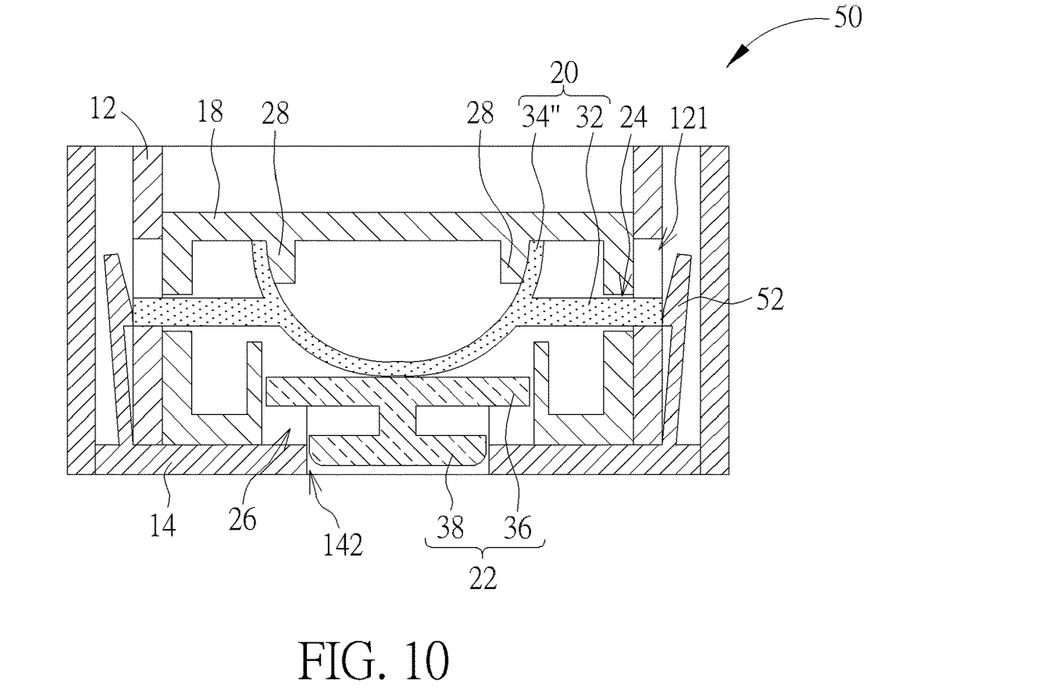

Please refer to FIG. 8 to FIG. 10. FIG. 8 is an exploded diagram of the reciprocator-type quick-releasing mechanism 50 according to a third embodiment of the present disclosure. FIG. 9 and FIG. 10 respectively are diagrams of the reciprocator-type quick-releasing mechanism 50 in different operation mode according to the third embodiment of the present disclosure. In the third embodiment, elements having the same numerals as one of the foresaid embodiments have the same structures and functions, and a detailed description is omitted herein for simplicity. The reciprocator-type quick-releasing mechanism 50 can be applied to the second module 14 having a buckling portion 52, and the buckling portion 52 of the second module 14 is buckled with the aperture 121 formed on the first module 12. The base 18 includes the first piercing hole 24 and the first opening 26, and the first piercing hole 24 faces the buckling portion 52. The constraining portion 32 of the latching component 20 aligns with the first piercing hole 24 and the buckling portion 52, and the constraining portion 32 is connected to position located between the middle region and one of the two opposite ends of the resilient portion 34".

In the third embodiment, the resilient portion 34" is the arc structure. The two opposite ends of the resilient portion 34" are engaged with the engaging portions 28 of the base 18, and the pushing portion 36 of the actuating component 22 presses the middle region of the resilient portion 34" in a separable manner. In addition, the pushing portion 36 and the actuating portion 38 of the actuating component 22 are connected with each other, and the pushing portion 36 aligns with the first opening 26 and the second opening 142 for being an operation interface. As shown in FIG. 9, the reciprocator-type quick-releasing mechanism 50 is set in an initial mode, the constraining portion 32 is located inside the first piercing hole 24 (or inside the first piercing hole 24 and the aperture 121), the buckling portion 52 is buckled with the aperture 121, and the first module 12 cannot be disassembled from the second module 14. As shown in FIG. 10, the actuating portion 38 is pressed into the second opening 142, the resilient portion 34" is flexibly and resiliently deformed by pressure of the pushing portion 36, the resilient portion 34" flexibly and resiliently deformed moves the constraining portion 32 outwardly, the buckling portion 52 is left away the aperture 121 via the constraining portion 32, and the first module 12 can be freely disassembled from the second module 14.

Figure 11:
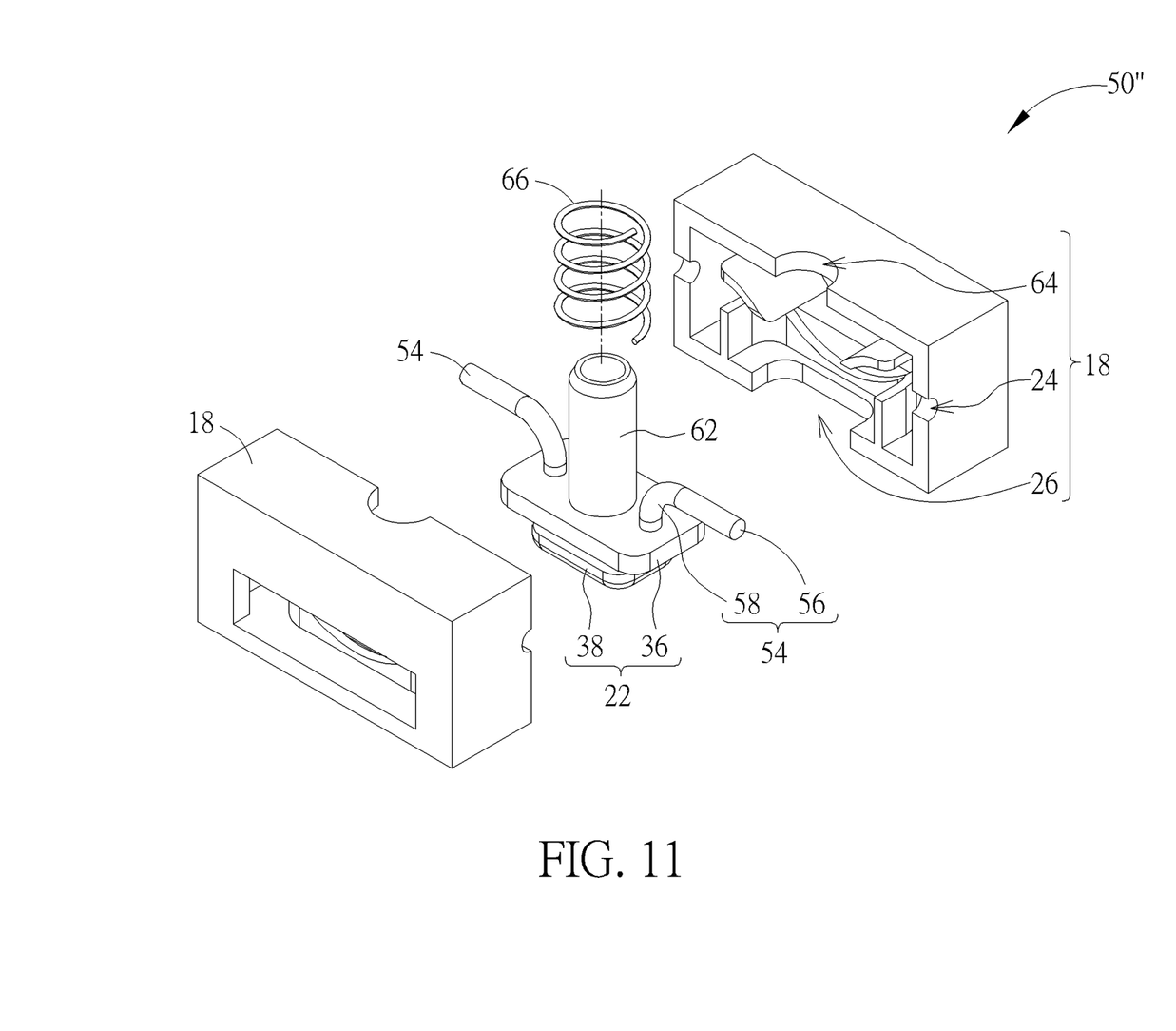
FIG. 11 is an exploded diagram of the reciprocator-type quick-releasing mechanism according to a fourth embodiment of the present disclosure.
Figure 12:
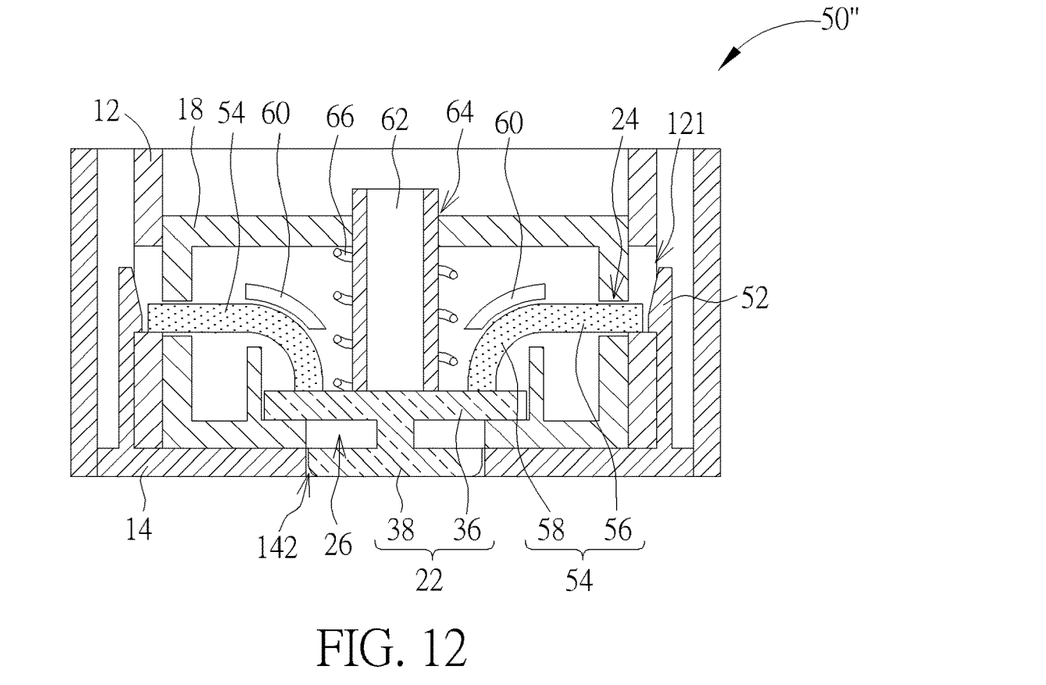
FIG. 12 and FIG. 13 respectively are diagrams of the reciprocator-type quick-releasing mechanism in different operation modes according to the fourth embodiment of the present disclosure.
Figure 13:
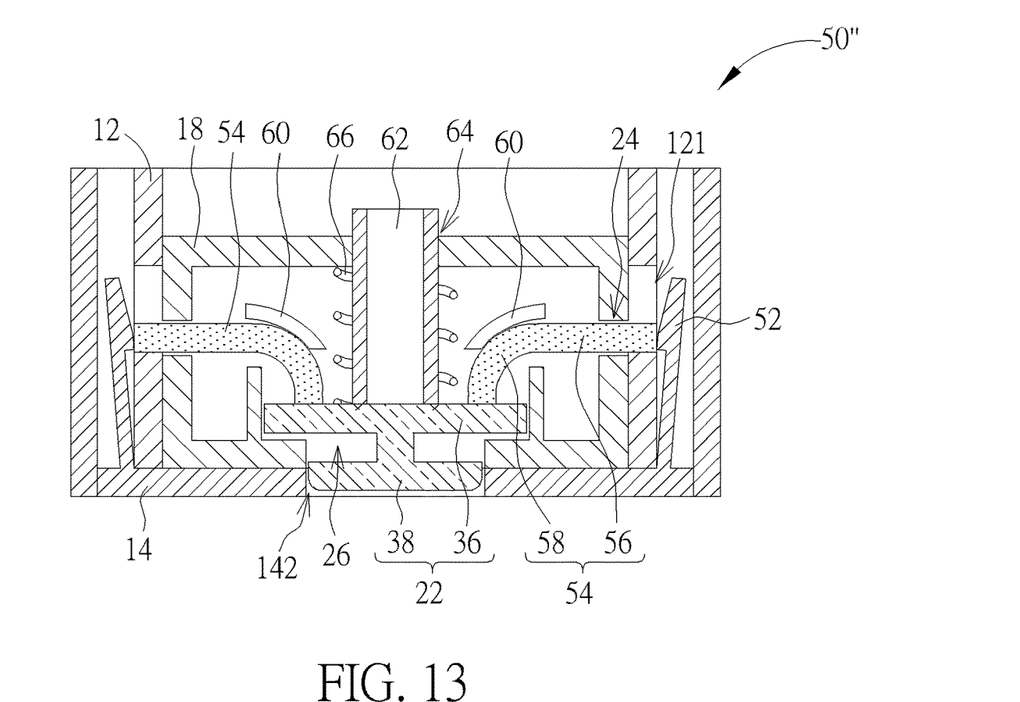

Please refer to FIG. 11 to FIG. 13. FIG. 11 is an exploded diagram of the reciprocator-type quick-releasing mechanism 50" according to a fourth embodiment of the present disclosure. FIG. 12 and FIG. 13 respectively are diagrams of the reciprocator-type quick-releasing mechanism 50" in different operation modes according to the fourth embodiment of the present disclosure. In the fourth embodiment, elements having the same numerals as one of the foresaid embodiments have the same structures and functions, and a detailed description is omitted herein for simplicity. The reciprocator-type quick-releasing mechanism 50" can be applied to the second module 14 having the buckling portion 52, and the buckling portion 52 is buckled with the aperture 121 on the first module 12. In the fourth embodiment, the latching component 54 includes the constraining portion 56 and the resilient portion 58, the constraining portion 56 aligns with the first piercing hole 24 and the buckling portion 52, the resilient portion 58 is designed as the arc structure or a bending bar structure, and two opposite ends of the resilient portion 58 are respectively connected to the constraining portion 56 and the pushing portion 36. That is to say, the latching component 54 and the actuating component 22 of the fourth embodiment are preferably designed as an integrated unit.

Further, the base 18 may include a stopping portion 60 contacting against a lateral edge of the resilient portion 58 for prevent the resilient portion 58 from over-bending by pressure of the actuating component 22. The actuating component 22 may include a guiding portion 62 connected to a side of the pushing portion 36 opposite to the actuating portion 38. The guiding portion 62 movably passes through a guiding hole 64 formed on the base 18, and the resilient component 66 is disposed on the guiding portion 62. Two opposite ends of the resilient component 66 respectively contact against an inner wall of the base 18 and an outer surface of the pushing portion 36. As shown in FIG. 12, the reciprocator-type quick-releasing mechanism 50" is set in an initial mode, the constraining portion 56 is located inside the first piercing hole 24 (or inside the first piercing hole 24 and the aperture 121), the buckling portion 52 is buckled with the aperture 121, and the first module 12 is assembled with the second module 14. As shown in FIG. 13, while the actuating portion 38 is pressed into the second opening 142, the resilient portion 58 is flexibly and resiliently deformed along the stopping portion 60 by the pushing portion 36, the deformed stopping portion 60 moves the constraining portion 56 out of the first piercing hole 24, the buckling portion 52 is pushed and left away the aperture 121, and the first module 12 can be disassembled from the second module 14.

Figure 14:
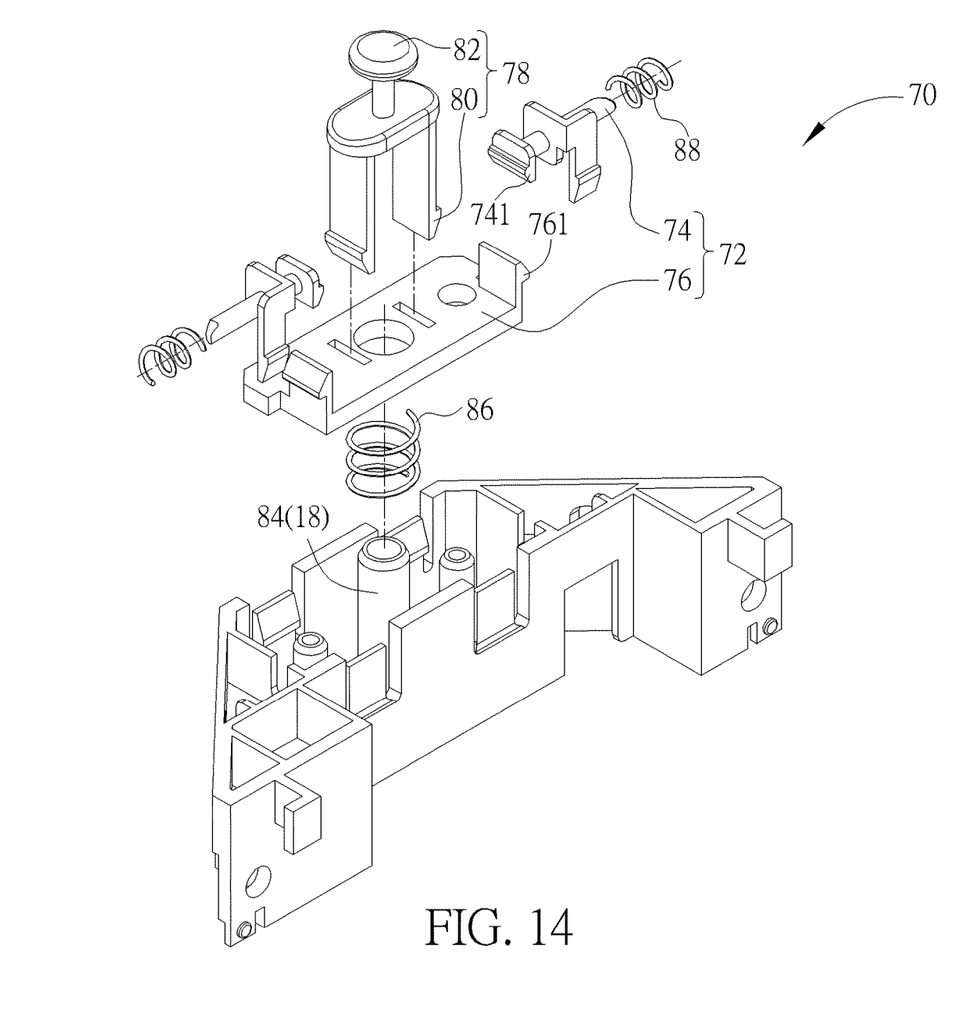
FIG. 14 is an exploded diagram of the reciprocator-type quick-releasing mechanism according to a fifth embodiment of the present disclosure.
Figure 15:
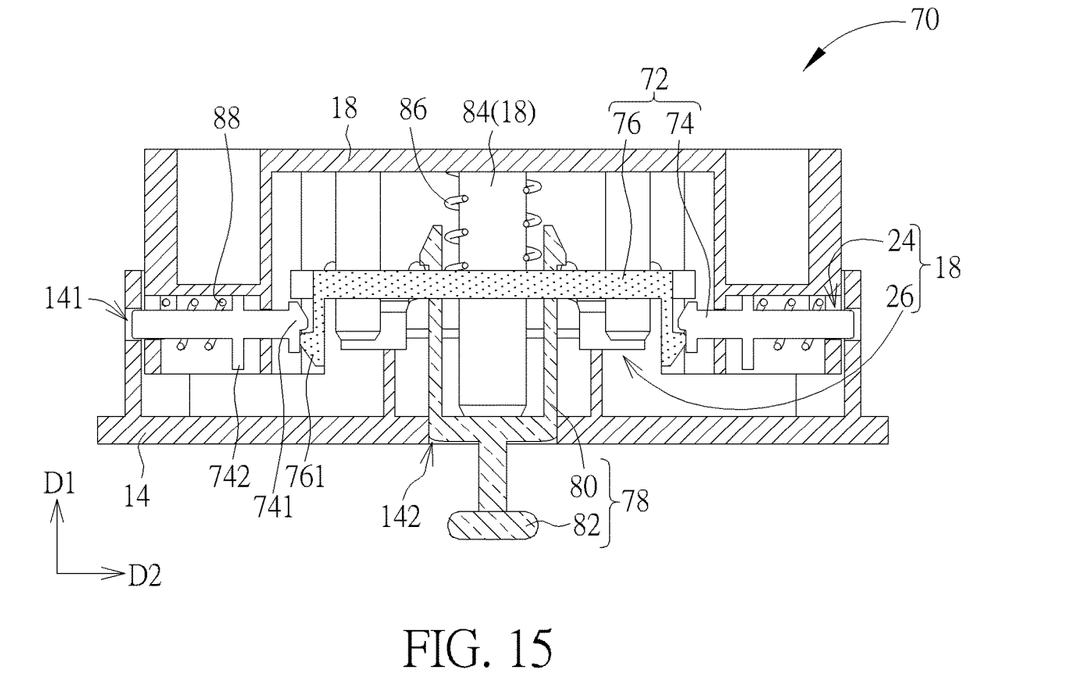
FIG. 15 and FIG. 16 respectively are diagrams of the reciprocator-type quick-releasing mechanism in different operation modes according to the fifth embodiment of the present disclosure.
Figure 16:
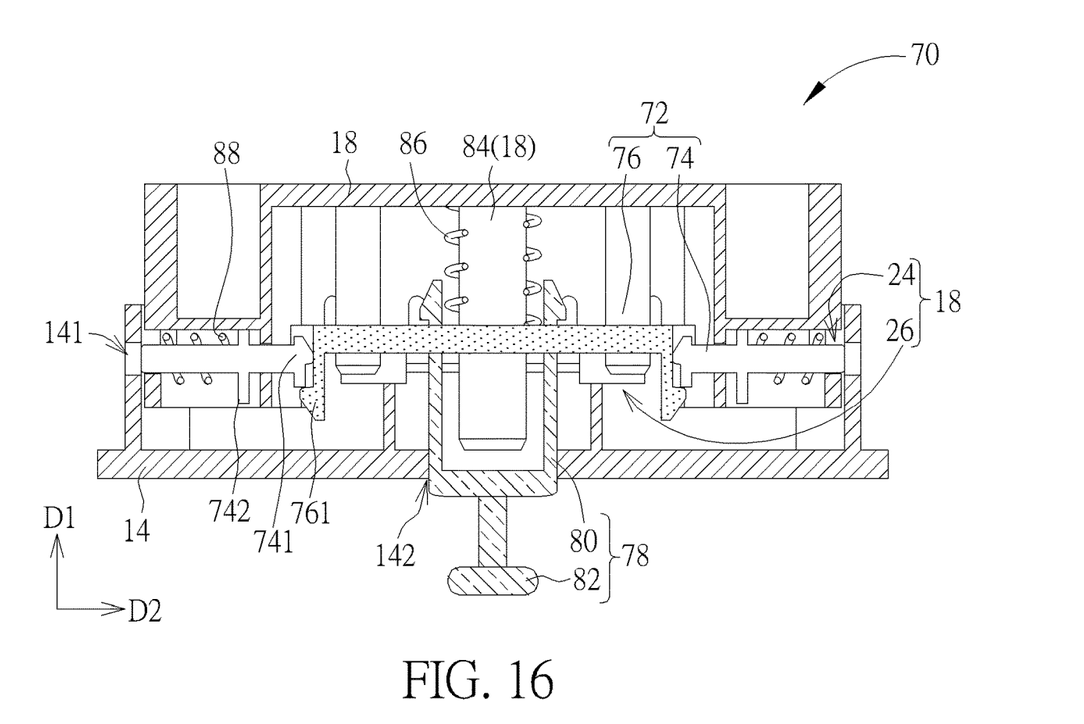

Please refer to FIG. 14 to FIG. 16. FIG. 14 is an exploded diagram of the reciprocator-type quick-releasing mechanism 70 according to a fifth embodiment of the present disclosure. FIG. 15 and FIG. 16 respectively are diagrams of the reciprocator-type quick-releasing mechanism 70 in different operation modes according to the fifth embodiment of the present disclosure. In the fifth embodiment, elements having the same numerals as one of the foresaid embodiments have the same structures and functions, and a detailed description is omitted herein for simplicity. The latching component 72 of the reciprocator-type quick-releasing mechanism 70 includes a constraining portion 74 and a resilient portion 76, the constraining portion 74 is disposed inside the first piercing hole 24 on the base 18, and the resilient portion 76 is connected to the constraining portion 74 in a relative slidable manner. For example, a first inclined guiding structure 741 is disposed on an edge of the constraining portion 74, and a second inclined guiding structure 761 is disposed on a lateral surface of the resilient portion 76. The resilient portion 76 which moves along a first direction D1 can drive a movement of the constraining portion 74 along a second direction D2 different from the first direction D1 in accordance with slidable contact between the first inclined guiding structure 741 and the second inclined guiding structure 761.

The actuating component 78 of the reciprocator-type quick-releasing mechanism 70 includes a pushing portion 80 and an actuating portion 82. The pushing portion 80 passes through the resilient portion 76 to dispose the actuating component 78 on the base 18, and the actuating component 78 is assembled with the latching component 72 in an inseparable manner. The actuating portion 82 is connected to the pushing portion 80, and aligns with the first opening 26 and the second opening 142 formed on the second module 14. The base 18 further may include a guiding portion 84 movably passing through the resilient portion 76. A resilient component 86 of the reciprocator-type quick-releasing mechanism 70 is disposed on the guiding portion 84, and two opposite ends of the resilient component 86 respectively contact against the latching component 72 and the actuating component 78 (not shown in figures), or respectively contact against the latching component 72 and the base 18 (which can be shown in FIG. 15 and FIG. 16). The resilient portion 76 is mainly utilized to press the resilient component 86 for generating resilient deformation, and the resilient portion 76 may be slightly deformed accordingly. The latching component 72 further disposes a recovering component 88 on the constraining portion 74, and two opposite ends of the recovering component 88 respectively contact against the base 18 and a block 742 of the constraining portion 74.

As shown in FIG. 15, the reciprocator-type quick-releasing mechanism 70 is set in an initial mode, the constraining portion 74 is kept to insert into the first piercing hole 24 formed on the base 18 and the second piercing hole 141 formed on the second module 14 for generating the structural interference; meanwhile, the first module 12 cannot be disassembled from the second module 14. As shown in FIG. 16, the actuating portion 82 is pulled outwardly, and the resilient portion 76 is slid relative to the constraining portion 74 by the pushing portion 80. A resilient recovering force of the recovering component 88 is utilized to move the constraining portion 74 relative to the first piercing hole 24 and into the base 18 in accordance with misalign between the first inclined guiding structure 741 and the second inclined guiding structure 761, the constraining portion 74 is left away the second piercing hole 141, and the first module 12 connected to the base 18 can be freely disassembled from the second module 14.

Figure 17:
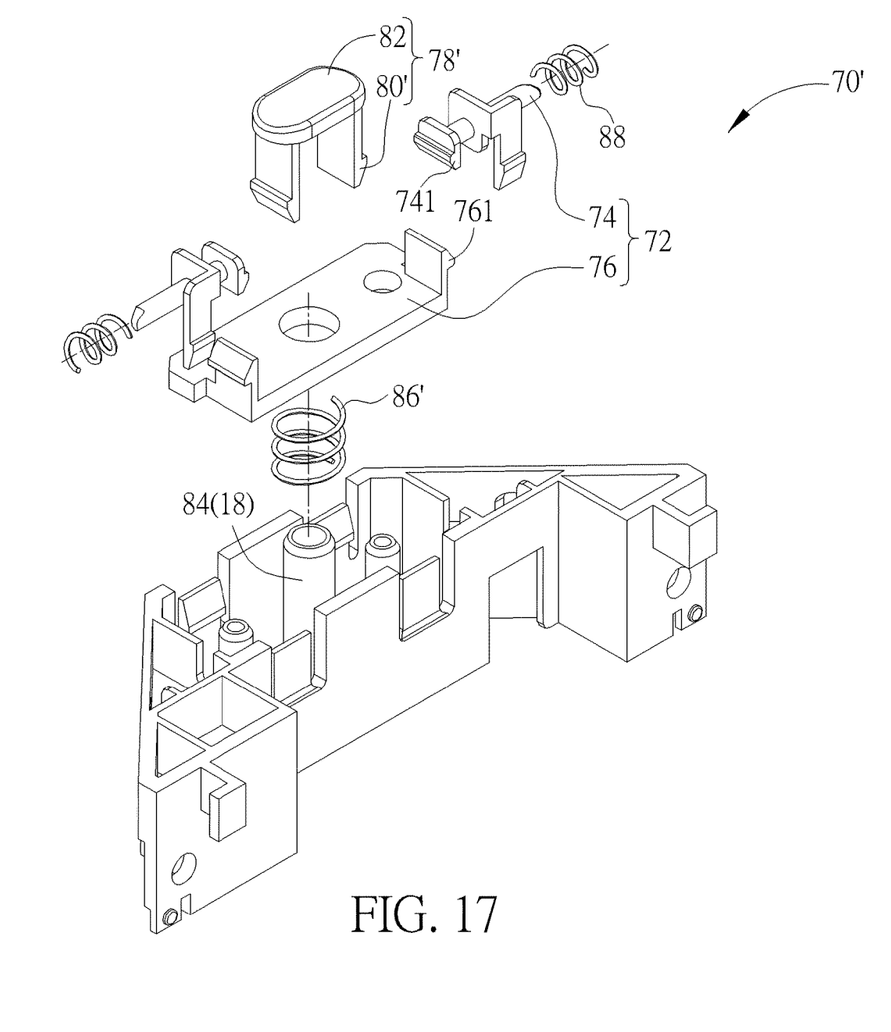
FIG. 17 is an exploded diagram of a reciprocator-type quick-releasing mechanism according to a sixth embodiment of the present disclosure.
Figure 18:
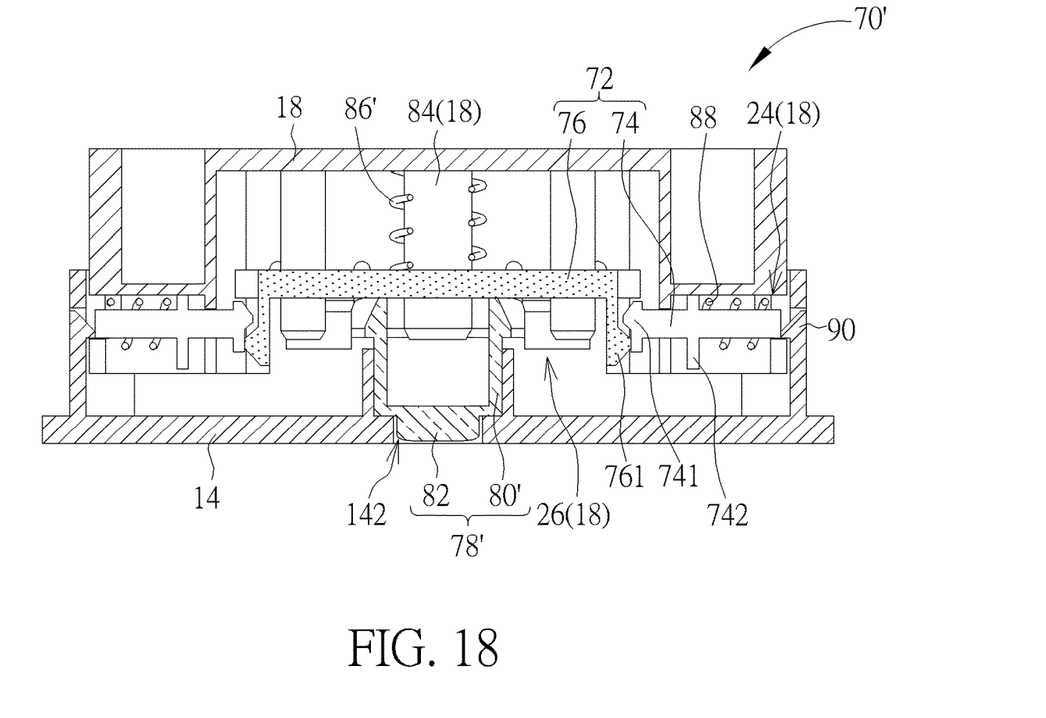
FIG. 18 and FIG. 19 respectively are diagrams of the reciprocator-type quick-releasing mechanism in different operation modes according to the sixth embodiment of the present disclosure.
Figure 19:
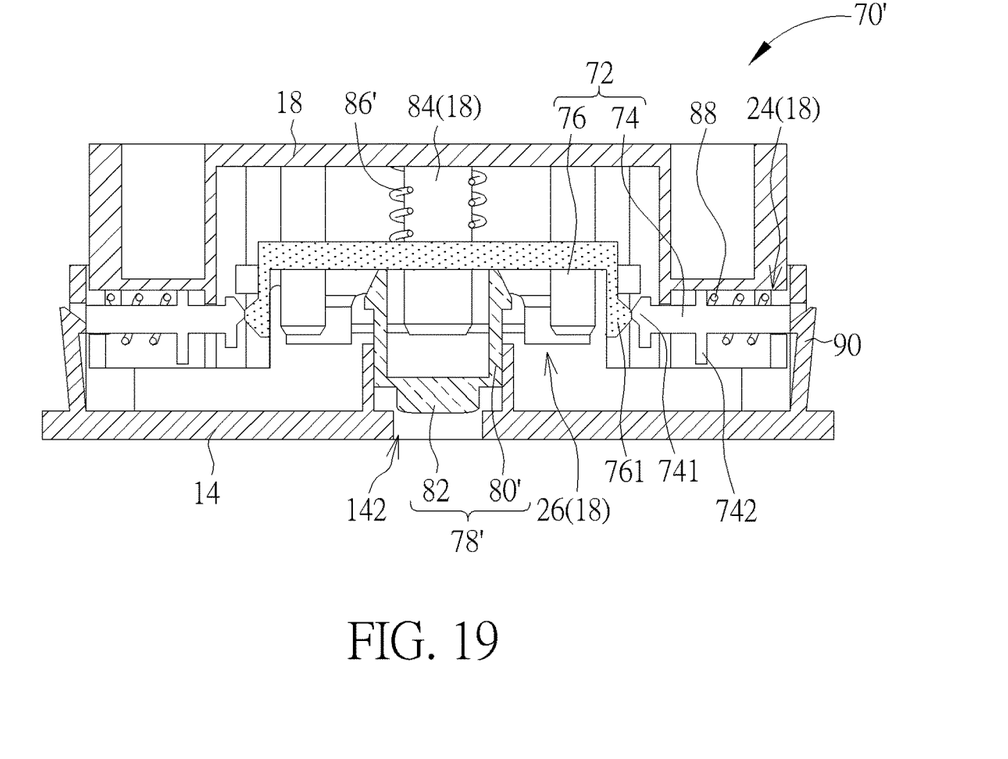

Please refer to FIG. 17 to FIG. 19. FIG. 17 is an exploded diagram of a reciprocator-type quick-releasing mechanism 70' according to a sixth embodiment of the present disclosure. FIG. 18 and FIG. 19 respectively are diagrams of the reciprocator-type quick-releasing mechanism 70' in different operation modes according to the sixth embodiment of the present disclosure. In the sixth embodiment, elements having the same numerals as one of the foresaid embodiments have the same structures and functions, and a detailed description is omitted herein for simplicity. Difference between the sixth embodiment and the fifth embodiment is: the second module 14 has no second piercing hole, and the second module 14 utilizes a buckling portion 90 to buckle with the first piercing hole 24 on the base 18 (or simultaneously buckle with the first piercing hole 24 and the aperture 121 on the first module 12). The reciprocator-type quick-releasing mechanism 70' is activated to release constraint between the first module 12 and the second module 14 by pushing the buckling portion 90 out of the first piercing hole 24. As shown in FIG. 17, the actuating component 78' of the reciprocator-type quick-releasing mechanism 70' is disposed on the second module 14, and the latching component 72 is actuated by the actuating component 78' in a separable manner, which means the pushing portion 80' does not pass through the resilient portion 76. The resilient component 86' of the reciprocator-type quick-releasing mechanism 70' is disposed on the guiding portion 84, and two opposite ends of the resilient component 86' respectively contact against the latching component 72 and the base 18.

As shown in FIG. 18, the reciprocator-type quick-releasing mechanism 70' is set in an initial mode, the buckling portion 90 is buckled with the first piercing hole 24 (or the aperture 121), and the first module 12 is assembled with the second module 14. As shown in FIG. 19, the actuating portion 82 is pressed into the second opening 142, the pushing portion 80' drives a slide of the resilient portion 76 relative to the constraining portion 74, the constraining portion 74 is moved out of the first piercing hole 24 by relative slide between the first inclined guiding structure 741 and the second inclined guiding structure 761, the buckling portion 90 is left away the first piercing hole 24, and the first module 12 can be freely disassembled from the second module 14. While an external force applied to the actuating portion 82 is removed, the actuating portion 82 is back to the initial mode via a resilient recovering force of the resilient component 86', and the resilient recovering force of the recovering component 88 moves the constraining portion 74 into the first piercing hole 24; in the meantime, the buckling portion 90 can be re-buckled with the first piercing hole 24 to assemble the first module 12 inside the second module 14.

In conclusion, the user can press the reciprocator-type quick-releasing mechanism exposed from the outer surface of the second module to release constraint of a relative movement between the first module and the second module. The reciprocator-type quick-releasing mechanism can be arbitrarily disposed on a bottom surface or a lateral surface of the second module, which depends on user's demand. The present disclosure provides several embodiments of the reciprocator-type quick-releasing mechanism, the reciprocator-type quick-releasing mechanism can be activated by the pressing or pulling manner, and the reciprocator-type quick-releasing mechanism has an automatic recovering function for rapidly assembly and disassembly of the first module and the second module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reciprocator-type quick-releasing mechanism of conveniently assembling two modules, the reciprocator-type quick-releasing mechanism comprising:
   a base having a first piercing hole and a first opening;
   a latching component disposed on the base, the latching component comprising:
      a constraining portion disposed inside the first piercing hole; and
      a resilient portion connected to the constraining portion in a relative slidable manner; and
   an actuating component slidably disposed on the base, the actuating component comprising:
      a pushing portion contacting the resilient portion to guide a movement of the resilient portion; and
      an actuating portion connected to the pushing portion and aligning with the first opening and a second opening on an external unit, the actuating portion moving relative to the second opening by an external force to slide the resilient portion relative to the constraining portion via the pushing portion, so as to move the constraining portion through the first piercing hole for letting the constraining portion leave away a second piercing hole on the external unit or pushing a buckling portion of the external unit;
   wherein the base is disposed inside a first module, the external unit is a second module where on the second opening and the second piercing hole and the buckling portion are formed, and the reciprocator-type quick-releasing mechanism is used to assemble the first module and the second module.

2. The reciprocator-type quick-releasing mechanism of claim 1, wherein a first inclined guiding structure is disposed on an edge of the constraining portion, a second inclined guiding structure is disposed on a lateral surface of the resilient portion, and the second inclined guiding structure slidably contacts against the first inclined guiding structure.

3. The reciprocator-type quick-releasing mechanism of claim 1, wherein the base further comprises a guiding portion whereon the resilient portion is movably disposed.

4. The reciprocator-type quick-releasing mechanism of claim 3, wherein the reciprocator-type quick-releasing mechanism further comprises a resilient component disposed on the guiding portion, two opposite ends of the resilient component respectively contact against the latching component and the actuating component, or respectively contact against the latching component and the base.

5. The reciprocator-type quick-releasing mechanism of claim 1, wherein the latching component further comprises a recovering component disposed on the constraining portion, two opposite ends of the recovering component respectively contact against the base and a block of the constraining portion.

6. The reciprocator-type quick-releasing mechanism of claim 1, wherein the actuating component is disposed on the base, the actuating component is assembled with the latching component in an inseparable manner.

7. The reciprocator-type quick-releasing mechanism of claim 6, wherein the constraining portion simultaneously passes through the first piercing hole and the second piercing hole to constrain a relative movement between the first module and the second module.

8. The reciprocator-type quick-releasing mechanism of claim 1, wherein the actuating component is disposed on the second module, the latching component is actuated by the actuating component in a separable manner.

9. The reciprocator-type quick-releasing mechanism of claim 8, wherein the buckling portion of the second module is buckled with the first piercing hole on the base.

* * * * *